(12) United States Patent
Hosseini et al.

(10) Patent No.: US 8,884,420 B1
(45) Date of Patent: Nov. 11, 2014

(54) MULTICHIP DEVICE

(71) Applicant: Infineon Technologies Austria AG, Villach (AT)

(72) Inventors: Khalil Hosseini, Weihmichl (DE); Joachim Mahler, Regensburg (DE); Ivan Nikitin, Regensburg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/940,577

(22) Filed: Jul. 12, 2013

(51) Int. Cl.
*H01L 33/00* (2010.01)
*H01L 23/495* (2006.01)

(52) U.S. Cl.
CPC ................ *H01L 23/49575* (2013.01)
USPC .... 257/686; 257/676; 257/777; 257/E23.065; 257/E23.069

(58) Field of Classification Search
CPC ................................................ H01L 23/49575
USPC ................ 257/668–686, 723, 777, E21.499, 257/E23.031, 65–69, 141, 25.013, 23
See application file for complete search history.

(56) References Cited

U.S. PATENT DOCUMENTS

| | | | |
|---|---|---|---|
| 5,247,423 A * | 9/1993 | Lin et al. ................. | 361/719 |
| 7,180,167 B2 * | 2/2007 | Partridge et al. ........... | 257/686 |
| 7,271,470 B1 * | 9/2007 | Otremba .................. | 257/666 |
| 7,626,262 B2 * | 12/2009 | Otremba et al. .......... | 257/737 |
| 7,659,611 B2 * | 2/2010 | Otremba .................. | 257/690 |
| 7,705,436 B2 * | 4/2010 | Mahler et al. ............ | 257/676 |
| 7,745,929 B2 * | 6/2010 | Otremba .................. | 257/718 |
| 7,757,392 B2 * | 7/2010 | Otremba .................. | 29/840 |
| 7,786,558 B2 * | 8/2010 | Otremba .................. | 257/678 |
| 7,880,280 B2 * | 2/2011 | Otremba .................. | 257/676 |
| 8,129,225 B2 | 3/2012 | Landau et al. | |
| 8,637,977 B2 * | 1/2014 | Lim et al. ................ | 257/696 |
| 8,698,288 B1 * | 4/2014 | Low et al. ................ | 257/668 |
| 2004/0043643 A1 * | 3/2004 | Adams et al. ............. | 439/71 |
| 2008/0197463 A1 * | 8/2008 | Otremba .................. | 257/676 |
| 2009/0042337 A1 | 2/2009 | Landau et al. | |
| 2010/0051345 A1 * | 3/2010 | Van Gemert et al. ...... | 174/521 |
| 2013/0256856 A1 * | 10/2013 | Mahler et al. ............ | 257/676 |

\* cited by examiner

*Primary Examiner* — Michael Lebentritt
(74) *Attorney, Agent, or Firm* — Murphy, Bilak & Homiller, PLLC

(57) ABSTRACT

A multichip device includes a first semiconductor chip arranged over a first carrier and a second semiconductor chip arranged over a second carrier. The multichip device further includes an electrically conductive element electrically coupling the first semiconductor chip and the second semiconductor chip. The electrically conductive element includes a first exposed contact area.

20 Claims, 5 Drawing Sheets

MULTICHIP DEVICE

TECHNICAL FIELD

The disclosure relates to multichip devices and methods for manufacturing multichip devices.

BACKGROUND

Electronic devices may include multiple semiconductor chips that may be electrically connected with each another. Such multichip devices and methods for manufacturing the multichip devices constantly have to be improved. It may be desirable to improve a performance and a quality of the multichip devices. In particular, it may be desirable to increase an integration density and to improve a thermal management of the multichip devices.

SUMMARY

According to an embodiment of multichip device, the multichip device comprises a first semiconductor chip arranged over a first carrier, a second semiconductor chip arranged over a second carrier, and an electrically conductive element electrically coupling the first semiconductor chip and the second semiconductor chip. The electrically conductive element comprises a first exposed contact area.

According to another embodiment of multichip device, the multichip device comprises a first semiconductor chip, a second semiconductor chip, and a T-shaped electrically conductive element comprising a first end section, a second end section and a third end section. The first end section is electrically coupled to the first semiconductor chip. The second end section is electrically coupled to the second semiconductor chip. The third end section comprises an exposed contact area.

According to yet another embodiment of multichip device, the multichip device comprises a first semiconductor chip, a second semiconductor chip, and an L-shaped electrically conductive element comprising a first part and a second part substantially perpendicular to the first part. The first part electrically couples the first semiconductor chip and the second semiconductor chip. The second part comprises an exposed contact area.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

DETAILED DESCRIPTION

Figure 1:
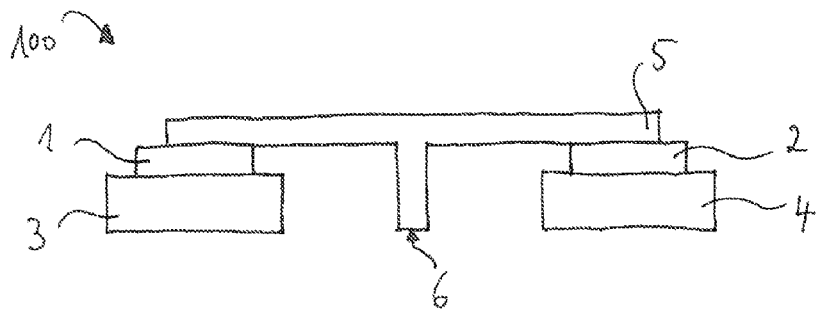
FIG. 1 schematically illustrates a cross-sectional view of a multichip device according to an embodiment.

In the following detailed description, reference is made to the accompanying drawings, which form a part hereof, and in which is shown by way of illustration specific aspects in which the disclosure may be practiced. In this regard, directional terminology, such as "top," "bottom," "front," "back," etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present disclosure. The following detailed description, therefore, is not to be taken in a limiting sense, and the scope of the present disclosure is defined by the appended claims.

As employed in this specification, the terms "coupled" and/or "electrically coupled" are not meant to mean that the elements must be directly coupled together. Intervening elements may be provided between the "coupled" or "electrically coupled" elements.

Devices and methods for manufacturing such devices are described herein. It is understood that comments made in connection with a described device may also hold true for a corresponding method and vice versa. For example, if a specific component of a device is described, a corresponding method for manufacturing the device may include an act of providing the component in a suitable manner, even if such an act is not explicitly described or illustrated in the figures. In addition, it is understood that the features of the various exemplary aspects described herein may be combined with each other, unless specifically noted otherwise.

The devices described herein may include one or more semiconductor chips. The semiconductor chips may be of different types and may be manufactured by different technologies. For example, the semiconductor chips may include integrated electrical, electro-optical or electro-mechanical circuits, or passives. The integrated circuits may be designed as logic integrated circuits, analog integrated circuits, mixed signal integrated circuits, power integrated circuits, memory circuits, integrated passives, or micro-electro mechanical systems that may include micro-mechanical structures, such as bridges, membranes, or tongue structures. The semiconductor chips need not be manufactured from specific semiconductor material, for example, Si, SiC, SiGe, GaAs, and, furthermore, may contain inorganic and/or organic materials that are not semiconductors, such as, for example, insulators, plastics or metals. Moreover, the semiconductor chips may be packaged or unpackaged.

In particular, the semiconductor chips may include one or more power semiconductors. The semiconductor chips (or power semiconductor chips) may have a vertical structure, i.e. the semiconductor chips may be fabricated such that electric currents may flow in a direction perpendicular to the main faces of the semiconductor chips. A semiconductor chip having a vertical structure may have electrodes on its two main faces, i.e. on its top side and bottom side. In particular, power semiconductor chips may have a vertical structure and may have load electrodes on both main faces. For example, the vertical power semiconductor chips may be configured as power MOSFETs (Metal Oxide Semiconductor Field Effect Transistors), IGBTs (Insulated Gate Bipolar Transistors), JFETs (Junction Gate Field Effect Transistors), super junction devices, power bipolar transistors, etc. The source electrode and gate electrode of a power MOSFET may be situated on one face, while the drain electrode of the power MOSFET may be arranged on the other face. In addition, the devices described herein may include integrated circuits to control the integrated circuits of the power semiconductor chips.

The semiconductor chips may have contact pads (or contact elements or contact terminals or contact electrodes) which may allow electrical contact to be made with integrated circuits included in the semiconductor chips. For the case of a power semiconductor chip, a contact pad may correspond to a gate electrode, a source electrode, or a drain electrode. The contact pads may include one or more metal layers that may be applied to the semiconductor material. The metal layers may be manufactured with any desired geometric shape and any desired material composition. Any desired metal or metal alloy, for example at least one of aluminum, titanium, gold, silver, copper, palladium, platinum, nickel, chromium, and nickel vanadium, may be used as the material. The metal layers need not be homogenous or manufactured from just one material, i.e. various compositions and concentrations of the materials contained in the metal layers may be possible.

The devices described herein may include a carrier over (or on) which a semiconductor chip may be arranged. The devices are not restricted to merely include one single carrier, but may also include multiple carriers. In addition, a semiconductor chip of the device may not exclusively be arranged over (or on) only one carrier, but may also be arranged over (or on) multiple carriers. The carrier may be manufactured of a metal, an alloy, a dielectric, a plastic, a ceramic, or a combination thereof. The carrier may have a homogeneous structure, but may also provide internal structures like conducting paths with an electric redistribution function. In addition, a footprint of the carrier may depend on the number and footprints of semiconductor chips arranged on the carrier. That is, the carrier may particularly include mounting areas configured to carry semiconductor chips. Examples for carriers are a die pad, a lead frame including a die pad, or a ceramic substrate including one or more redistribution layers.

In one example, the carrier may include a leadframe that may be of any shape, size and material. The leadframe may be structured such that die pads (or chip islands) and leads are formed. During a fabrication of the devices, the die pads and the leads may be connected to each other. The die pads and the leads may also be made from one piece. The die pads and the leads may be connected among each other by connection means with the purpose of separating some of the die pads and the leads in the course of the fabrication. Here, separating the die pads and the leads may be carried out by at least one of mechanical sawing, a laser beam, cutting, stamping, milling, etching, and any other appropriate technique. The leadframe may be electrically conductive. For example, it may be entirely fabricated from metals and/or metal alloys, in particular at least one of copper, copper alloys, nickel, iron nickel, aluminum, aluminum alloys, steel, stainless steel, and other appropriate materials. The leadframe may be plated with an electrically conductive material, for example at least one of copper, silver, palladium, gold, nickel, iron nickel, and nickel phosphorus. The leadframe may then also be referred to as "pre-plated leadframe". It is noted that, even though the leadframe may be electrically conductive, an arbitrary selection of die pads may be electrically insulated from each other.

The devices described herein may include an electrically conductive element. For example, the electrically conductive element may be configured to electrically connect a first semiconductor chip and a second semiconductor chip or to provide an electrical connection between a semiconductor chip and a component arranged externally to the device. In one example, the electrically conductive elements may include apart of a leadframe. All above comments made in connection with the above described leadframe thus may also hold true for the electrically conductive element. In another example, the electrically conductive element may include one or more contact clips. All comments made in connection with the above described leadframe may also hold true for the contact clip. The shape of the contact clip is not necessarily limited to a specific size or a specific geometric shape. The contact clip may be fabricated by at least one of stamping, punching, pressing, cutting, sawing, milling, and any other appropriate technique. A contact between the electrically conductive element and a contact pad of a semiconductor chip may be established by any appropriate technique. In one example, the electrically conductive element may be soldered to other components, for example by employing a diffusion soldering process.

The devices described herein may include an encapsulation material that may at least partly cover one or more components of the device. The encapsulation material may be electrically insulating and may form an encapsulation body. The encapsulation material may include any appropriate duroplastic, thermoplastic or thermosetting material, mold compound, or laminate (prepreg). Various techniques may be used to encapsulate the components with the encapsulation material, for example at least one of compression molding, injection molding, powder molding, liquid molding, and lamination.

The devices described herein may include one or more passive electronic components. For example, the passive electronic components may be integrated in a semiconductor material. Alternatively, the passive electronic components may be arranged in one or more layers, in particular metal layers. Passive electronic components may be or may include any kind of resistors, capacitors, inductive components like inductors or coils, antennas, etc. Any appropriate technique may be used for manufacturing the passive electronic components.

Figure 2:
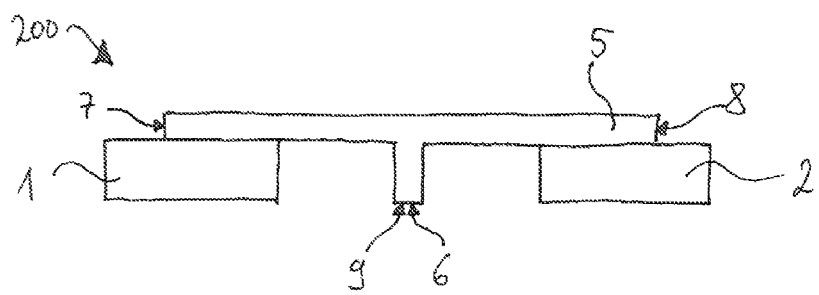
FIG. 2 schematically illustrates a cross-sectional view of a multichip device according to another embodiment.
Figure 3:
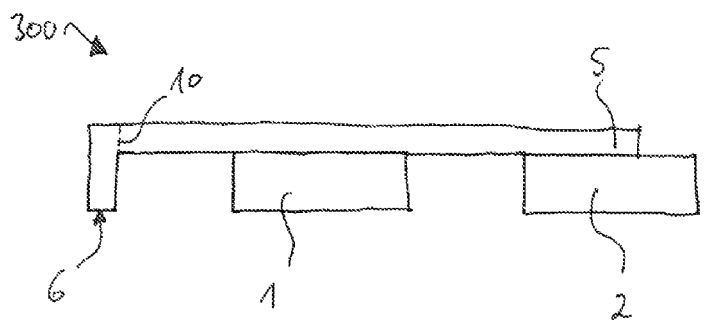
FIG. 3 schematically illustrates a cross-sectional view of a multichip device according to yet another embodiment.

FIGS. 1 to 3 illustrate multichip devices 100 to 300 in accordance with various embodiments. More detailed multichip devices similar to the multichip devices 100 to 300 as well as methods for manufacturing the multichip devices are described below. It is understood that features of the described multichip devices and methods may be combined with each other, unless specifically noted otherwise.

FIG. 1 schematically illustrates a cross-sectional view of a multichip device 100 according to an embodiment. The multichip device 100 may include a first semiconductor chip 1 that may be arranged over a first carrier 3. The multichip device 100 may further include a second semiconductor chip 2 that may be arranged over a second carrier 4. The multichip device 100 may further include an electrically conductive element 5 that may electrically couple the first semiconductor chip 1 and the second semiconductor chip 2. The electrically conductive element 5 may include a first exposed contact area 6.

FIG. 2 schematically illustrates a cross-sectional view of a multichip device 200 according to another embodiment. The multichip device 200 may include a first semiconductor chip 1 and a second semiconductor chip 2. The multichip device 200 may further include a T-shaped electrically conductive element 5 that may include a first end section 7, a second end section 8 and a third end section 9. The first end section 7 may be electrically coupled to the first semiconductor chip 1 while the second end section 8 may be electrically coupled to the second semiconductor chip 2. The third end section 9 may include an exposed contact area 6.

FIG. 3 schematically illustrates a cross-sectional view of a multichip device 300 according to yet another embodiment. The multichip device 300 may include a first semiconductor chip 1 and a second semiconductor chip 2. The multichip device 300 may further include an L-shaped electrically conductive element 5. The L-shaped electrically conductive element 5 may include a first part and a second part that may be substantially perpendicular to the first part. For illustrative purposes an exemplary dashed line 10 separates the first part from the second part. In the exemplary FIG. 3, the first part is illustrated as a horizontal part while the second part is shown as a vertical part. The first part may electrically couple the first semiconductor chip 1 and the second semiconductor chip 2. The second part may include an exposed contact area 6.

Figure 4A:
FIGS. 4A and 4B schematically illustrate respective cross-sectional views of a method for manufacturing a multichip device according to an embodiment.
Figure 4B:
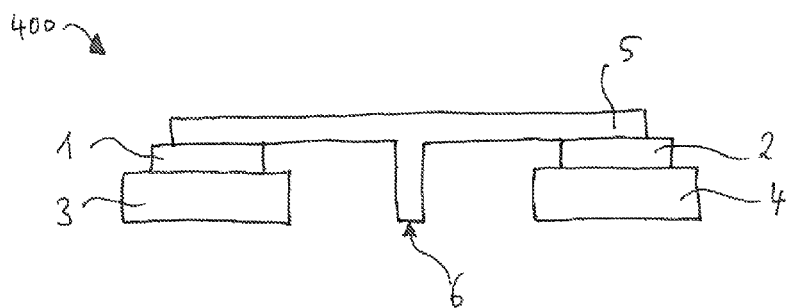

FIGS. 4A and 4B schematically illustrate a method for manufacturing a multichip device according to an embodiment. A cross section of a multichip device 400 obtained by the method is illustrated in FIG. 4B. For example, the multichip device 400 may be similar to the multichip device 100 of FIG. 1. In FIG. 4A, a first semiconductor chip 1 may be arranged over a first carrier 3, and a second semiconductor 2 chip may be arranged over a second carrier 4. In FIG. 4B, an electrically conductive element 5 may be provided such that the electrically conductive element 5 electrically couples the first semiconductor chip 1 and the second semiconductor chip 2. The electrically conductive element 5 may include a first exposed contact area 6.

Figure 5A:
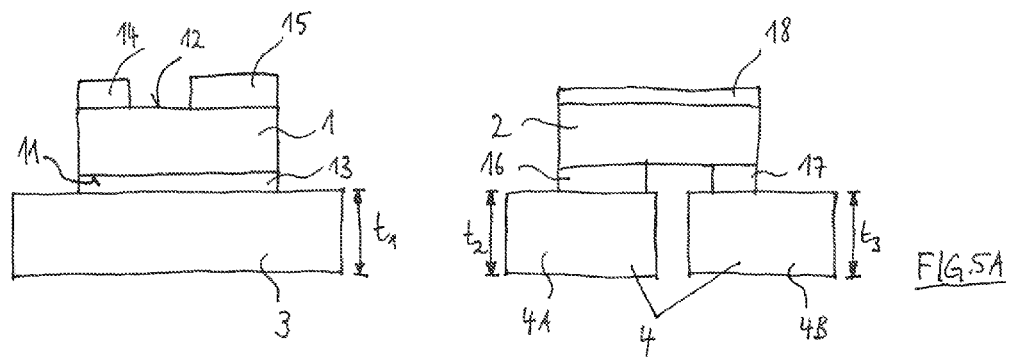
FIGS. 5A to 5D schematically illustrate respective cross-sectional views of a method for manufacturing a multichip device according to another embodiment.
Figure 5B:
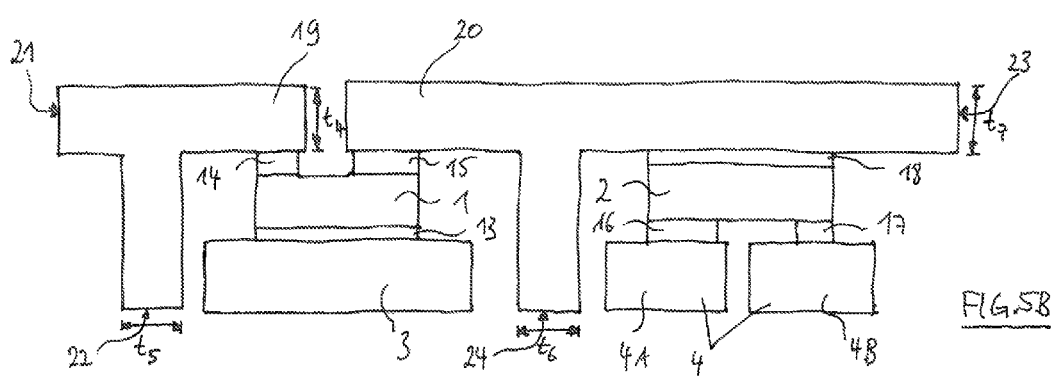
Figure 5C:
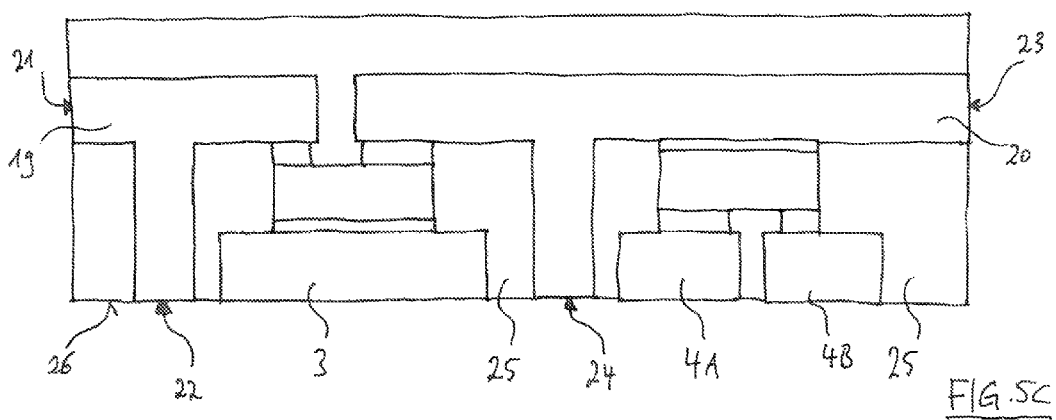
Figure 5D:
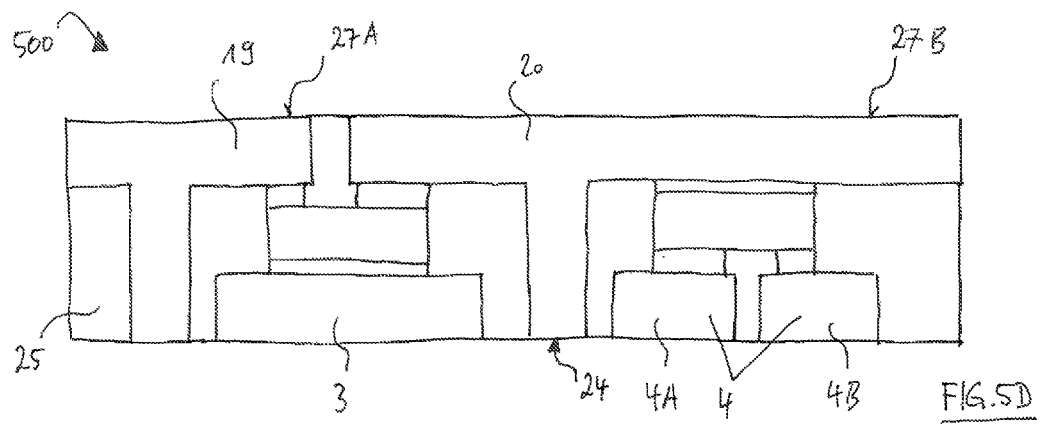

FIGS. 5A to 5D schematically illustrate a method for manufacturing a multichip device according to another embodiment. A cross section of an exemplary manufactured multichip device 500 obtained by the method is shown in FIG. 5D. Details of multichip devices manufactured according to the described method may be likewise applied to any other multichip device in accordance with the disclosure. In addition, the method shown in FIGS. 5A to 5D may be seen as an implementation of the method illustrated in FIGS. 2A and 2B. Details of the manufacturing method that are described below may therefore be likewise applied to the method of FIGS. 2A and 2B.

In FIG. 5A, a first semiconductor chip 1 may be arranged over (or on) a first carrier 3. The semiconductor chip 1 may be a power semiconductor chip having a first main surface 11 facing the first carrier 3 and an opposite second main surface 12 facing away from the carrier 3. A first electrical contact 13 may be arranged over (or on) the first main surface 11. In particular, the first electrical contact 13 may include a drain electrode of the first semiconductor chip 1. The footprint of the first main surface 11 may be arbitrary. For example, the footprint may be of rectangular, circular or quadratic shape. Similarly, the drain electrode 13 may be of arbitrary size or shape. In particular, the drain electrode 13 may cover a main part of the first main surface 11, and more particular the drain electrode 13 may completely cover the first main surface 11.

The drain electrode 13 may be electrically coupled to the first carrier 3 which may be made of an electrically conductive material. In one example, the drain electrode 13 may be in direct physical contact with the first carrier 3. In another example, further electrically conductive material may be arranged between the drain electrode 13 and the first carrier 3. Such additional material may e.g. be formed as one or more material layers. In one example, the first semiconductor chip 1 may be attached to the first carrier 3 by means of an electrically conductive adhesive. In another example, a connection between the drain electrode 13 and the first carrier 3 may be established by using a sintering process or a diffusion soldering process. Here, inter-metallic phases may occur between the drain electrode 13 and the first carrier 3. The description made in connection with the electrical connection between the drain electrode 13 and the first carrier 3 may also hold true for any other electrical connections described herein.

A second electrical contact 14 and a third electrical contact 15 may be arranged over (or on) the second main surface 12 of the first semiconductor chip 1. In particular, the second electrical contact 14 may include a gate electrode of the first semiconductor chip 1, and the third electrical contact 15 may include a source electrode of the first semiconductor chip 1. The footprint of the second main surface 12 may be arbitrary and may coincide with the footprint of the first main surface 11. Each of the gate electrode 14 and the source electrode 15 may be of arbitrary size of shape. In particular, the size of the gate electrode may be smaller than the size of the source electrode. For example, the gate electrode 14 may be substantially arranged in a corner of an (e.g. rectangular) second main surface 12 while the source electrode 15 may substantially cover the remaining part of the second main surface 12. In particular, the gate electrode 14 and the source electrode 15 may be electrically insulated from each other.

The first carrier 3 may be made of an arbitrary material and may be of arbitrary size or shape. In particular, the first carrier 3 may include a part of a structured carrier, for example a leadframe. A thickness $t_1$ of the first carrier 3 may particularly be smaller than about 1.5 mm, more particularly smaller than about 1 mm. A footprint of the first carrier 3 may be greater than a footprint of the first semiconductor chip 1 and thus greater than a footprint of the drain electrode 13. That is, the contact area of the drain electrode 13 may be completely covered by the first carrier 3.

In FIG. 5A, a second semiconductor chip 2 may be arranged over (or on) a second carrier 4. The second semiconductor chip 2 may be similar to the first semiconductor chip 1 such that the description made in connection with the first semiconductor chip 1 may also hold true for the second semiconductor chip 2. The second carrier 4 may include a first subcarrier 4A and a second subcarrier 4B which may be electrically insulated from each other. For example, the second carrier 4 may be apart of a structured carrier, e.g. a leadframe, which also includes the first carrier 3. Each of the first subcarrier 4A and the second subcarrier 4B may be electrically insulated from the first carrier 3. Thicknesses $t_2$ and $t_3$ of the first subcarrier 4A and the second subcarrier 4B may be similar to the thickness $t_1$ of the first carrier 3, respectively.

The second semiconductor chip 2 may include a first electrical contact 16, for example a source electrode, arranged over (or on) a main surface of the second semiconductor chip 2 facing the first subcarrier 4A. The source electrode 16 may be electrically connected to the first subcarrier 4A, wherein a footprint of the first subcarrier 4A may particularly be chosen to be greater than a footprint of the source electrode 16. The second semiconductor chip 2 may further include a second electrical contact 17, for example a gate electrode, arranged over (or on) the main surface of the second semiconductor chip 2 facing the second subcarrier 4B. The gate electrode 17 may be electrically connected to the second subcarrier 4B, wherein a footprint of the second subcarrier 4B may particularly be chosen to be greater than a footprint of the gate electrode 17. The second semiconductor chip 2 may further include a third electrical contact 18, for example a drain electrode, arranged over (or on) a main surface of the second semiconductor chip 2 facing away from the second carrier 4.

In FIG. 5B, a first electrically conductive element 19 and a second electrically conductive element 20 may be provided. In one example, at least one of the electrically conductive elements 19, 20 may include a part of a structured carrier, for example a part of a leadframe. In another example, at least one of the electrically conductive elements 19, 20 may include a clip. Thicknesses $t_4$, $t_5$, $t_6$ and $t_7$ of the conductive elements 19, 20 may lie in a range from about 100 micrometers to about 500 micrometers, more particular from about 150 micrometers to about 250 micrometers. The thicknesses $t_4$, $t_5$, $t_6$ and $t_7$ may be similar or may differ from one another.

The first electrically conductive element 19 may be T-shaped. The first electrically conductive element 19 may include a horizontal part and a vertical part arranged substantially perpendicular to the horizontal part. An end section of the horizontal part may be electrically connected to the gate electrode 14 of the first semiconductor chip 1. In particular, a (horizontal) footprint of the end section of the first electrically conductive element 19 may be greater than a footprint of the gate electrode 14. That is, the contact area of the gate electrode 14 may be completely covered by the first electrically conductive element 19. A further end section of the horizontal part of the first electrically conductive element 19 may include an exposed contact area 21. An end section of the perpendicular part of the first electrically conductive element 19 may include a further exposed contact area 22. The gate electrode 14 of the first semiconductor chip 1 can be electrically contacted via either or both of the exposed contact areas 21, 22.

The second electrically conductive element 20 may be T-shaped. The second electrically conductive element 20 may include a horizontal part and a vertical part arranged substantially perpendicular to the horizontal part. An end section of the horizontal part may be electrically connected to the source electrode 15 of the first semiconductor chip 1. Here, a (horizontal) footprint of the end section may be greater than a footprint (or contact area) of the source electrode 15. The horizontal part may further be electrically connected to the drain electrode 18 of the second semiconductor chip 2. The contact area of the drain electrode 18 may be completely covered by the horizontal part. The second electrically conductive element 20 may thus provide an electrical connection between the source electrode of the first semiconductor chip 1 and the drain electrode 18 of the second semiconductor chip 2. An end section of the horizontal part of the second electrically conductive element 20 may include an exposed contact area 23. In addition, an end section of the perpendicular part of the second electrically conductive element may include another exposed contact area 24. The source electrode 15 of the first semiconductor chip 1 and the drain electrode 18 of the second semiconductor chip 2 can be electrically contacted via either or both of the exposed contact areas 23, 24.

The electrically conductive elements 19, 20 and the carriers 3, 4 may be arranged such that various surfaces of the illustrated multichip device may be coplanar. For example, the upper surface of the first electrically conductive element 19 and the upper surface of the second electrically conductive element 20 may be coplanar. This may support mounting further components onto and/or depositing further material layers on the upper surfaces of the electrically conductive elements 19, 20. In addition, at least two of the exposed contact areas 22, 24 and the lower surfaces of the carriers 3, 4A, 4B may be coplanar. This may provide an opportunity to mount the multichip device on a further component, for example a Printed Circuit Board (PCB). The PCB (not illustrated) may include contact pads to which at least one of the exposed contact areas 22, 24 and the lower surfaces of the carriers 3, 4A, 4B may be connected.

In FIG. 5C, components of the multichip device may at least partly be encapsulated by an optional encapsulation material 25. In one example, the encapsulation material 25 may be applied such that one or more of the contact areas 21, 22, 23, 24 and the lower surfaces of the carrier 3, 4A, 4B remain exposed while the remaining components of the multichip device may be encapsulated. In other examples, further parts of the multichip device may remain exposed, i.e. remain uncovered by the encapsulation material 25. In FIG. 5C, the encapsulation material 25 at least partly covers the upper surfaces of the electrically conductive elements 19, 20. In another example, the upper surfaces of the electrically conductive elements 19, 20 may remain uncovered by the encapsulation material 25. The encapsulation material 25 may particularly be formed such that the lower surface 26 of the encapsulation material 25 may be coplanar with at least one of the exposed contact areas 22, 24 and the lower surfaces of the carriers 3, 4A, 4B. This may support mounting the encapsulated multichip device on a further component, for example a PCB.

At least one of the exposed contact areas 21, 22, 23, 24 may be configured to provide an electrical coupling between the respective electrically conductive element 19, 20 and a component arranged externally to the multichip device. The electrically conductive elements 19, 20 may thus provide a direct electrical connection between the semiconductor chips 1, 2 and external components via the exposed contact areas 21, 22, 23, 24 without contacting any of the carriers 3, 4. For example, a component may be defined as "external" when it is not encapsulated (or covered) by the encapsulation material 25. Alternatively, a component may be defined as an "external" when an electrical connection between the component and the semiconductor chips 1, 2 is established via contact areas arranged on a periphery of the multichip device, for example via the exposed contact areas 21, 22, 23, 24. Similarly, a contact area may e.g. be defined as "exposed" when the contact area is not covered by a material such that an external component may be (directly) electrically connected to the contact area.

In FIG. 5D, the encapsulation material 25 is at least partly removed such that at least one of the upper surfaces 27A, 27B of the electrically conductive elements 19, 20 become exposed. The act of encapsulation as shown in FIG. 5C and described above may have been performed such that removing the encapsulation material 25 from the upper surfaces 27A, 27B of the electrically conductive elements 19, 20 may not be necessary. Any appropriate technique may be used for removing the encapsulation material 25. In particular, the encapsulation material 25 may be removed such that the upper surfaces 27A, 27B of the electrically conductive elements 19, 20 and the encapsulation material 25 are coplanar. Exposing the electrically conductive elements 19, 20 may provide the possibility of connecting further components to the electrically conductive elements 19, 20. In addition, exposing the electrically conductive elements 19, 20 may support heat dissipation in a direction away from the multichip device 500.

In FIG. 5D, the second electrically conductive element 20 is T-shaped and arranged such that the exposed contact area 24 is substantially arranged between the first carrier 3 and the second carrier 4. The arrangement of FIG. 5D is exemplary and similar arrangements of different design are possible. For example, the second electrically conductive element 20 may be L-shaped, e.g. as illustrated in FIG. 3, such that the exposed contact area 24 may be substantially arranged next to the carriers 3, 4, but not between the carriers 3, 4. In another example, the second electrically conductive element 20 may include one or more additional vertical parts. For example, an additional vertical part may be arranged to the right of the subcarrier 4B, wherein an end part of the vertical part may provide an additional exposed contact area. The exposed contact area may be coplanar to at least one of the exposed contact areas 22, 24, the lower surface of the encapsulation material 25 and the lower surfaces of the carriers 3, 4A, 4B. In the case of additional vertical parts, at least a part of the second electrically conductive element 20 may be U-shaped.

The method described above may include further acts which are not explicitly illustrated herein. For example, further components may be arranged over (or on) at least one of the upper surfaces 27A, 27B of the multichip device 500. In one example, a heat sink may be mounted on the upper surface 27 of the multichip device 500. In another example, a passive electronic component may be arranged over (or on) one of the electrically conductive elements 19, 20. The passive electronic component may be electrically connected to the respective electrically conductive element 19, 20. For example, a capacitor or an inductor may be arranged between the source electrode 15 of the first semiconductor chip 1 and the drain electrode 18 of the second semiconductor chip 2.

The multichip device 500 may be configured to operate as a half bridge circuit. An exemplary schematic diagram of a half bridge circuit 800 is described in connection with FIG. 8. In particular, such a half bridge circuit may include a high side switch (S1) and a low side switch (S2). When using the multichip device 500 of FIG. 5D as a half bridge circuit, the first semiconductor chip 1 may include the high side switch, and the second semiconductor chip 2 may include the low side switch.

The method of FIGS. 5A to 5D and the multichip device 500 may have the following effects. Such effects may also be observed in connection with any other multichip device or method in accordance with the disclosure. The listed effects are neither exclusive nor limiting.

The multichip device 500 may be directly mounted on a further component, e.g. a PCB. No further auxiliary carrier may be required between the multichip device 500 and the further component it may be mounted on.

Compared to other multichip devices, a multichip device in accordance with the disclosure may require a reduced number of electrically conductive elements in order to provide a similar number of electrical connections and electrical contact areas.

Compared to other multichip devices, a multichip device in accordance with the disclosure may have in increased integration density.

Compared to other multichip devices, a multichip device in accordance with the disclosure may provide an increased electrical conductivity between components connected by the electrically conductive elements.

Compared to other methods for manufacturing multichip devices, a method in accordance with the disclosure may include a reduced number of manufacturing acts.

Compared to other multichip devices, a multichip device in accordance with the disclosure may provide a simplified design and structure.

The methods in accordance with the disclosure may provide the opportunity for efficiently manufacturing modular circuits.

Compared to other multichip devices, a multichip device in accordance with the disclosure may support heat dissipation in a direction away from the multichip device. In particular, it may be possible to provide a direct heat reduction at exposed contact surfaces.

The design and structure of the multichip devices in accordance with the disclosure may support mounting further components on the multichip device.

The method described in connection with FIGS. 5A to 5D has been described based on two semiconductor chips 1, 2 and two carriers 3, 4. However, a similar method may be performed based on an arbitrary number of semiconductor chips and carriers. That is, a manufactured multichip device may also include additional semiconductor chips and/or additional carriers depending on a desired functionality of the multichip device. In addition, the method of FIGS. 5A to 5D may be applied such that multiple multichip devices may be manufactured. For example, a structured carrier or leadframe including multiple sections may be used, wherein each of the sections includes a first carrier and a second carrier as shown in FIG. 5A. Each of these sections may then be processed according to the above described method. In a further act, the resulting structure may then be separated into multiple multichip devices, wherein each of the multichip devices may be similar to e.g. the multichip device 500. For example, the separation into multiple multichip devices may be performed after one of the acts of FIG. 5C or FIG. 5D. Any appropriate technique may be used for separating the structure, for example at least one of sawing, etching, cutting, dicing, etc.

Figure 6:
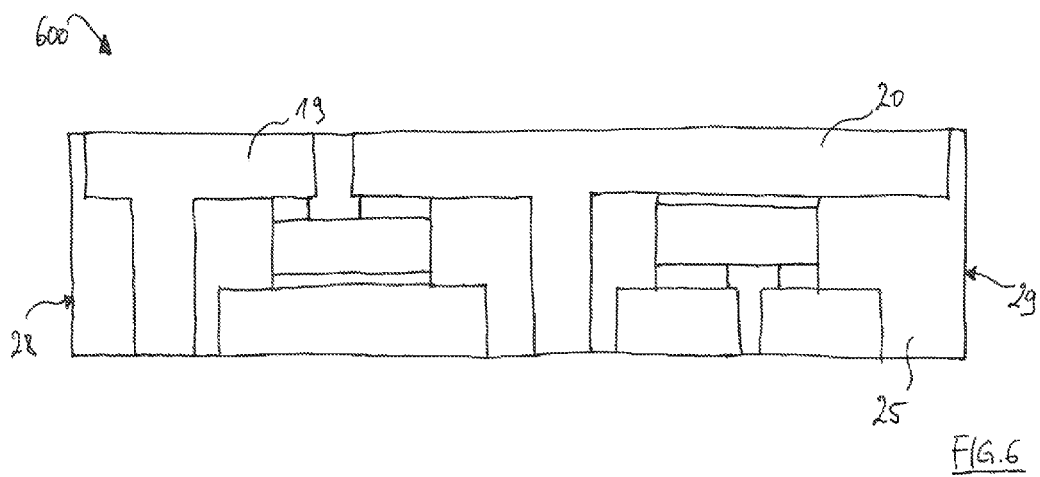
FIG. 6 schematically illustrates a cross-sectional view of a multichip device according to an embodiment.

FIG. 6 schematically illustrates a cross-sectional view of a multichip device 600 according to an embodiment. The multichip device 600 may be similar to the multichip device 500 of FIG. 5D. The description in connection with FIGS. 5A to 5D thus may also hold true for the multichip device 600 of FIG. 6. In FIG. 6, each of the first electrically conductive element 19 and the second electrically conductive element 20 may include a clip. The clips may be configured to provide a rewiring (or redistribution) as well as exposed contact areas that may be used for connecting external components to the multichip device 600. The multichip device 600 does not necessarily include the exposed contact areas 21, 23 arranged on the side surfaces of the multichip device 500 of FIG. 5D. Instead, the encapsulation material 25 may be arranged such that the side surfaces 28, 29 of the multichip device 600 may be formed by the encapsulation material 25.

Figure 7:
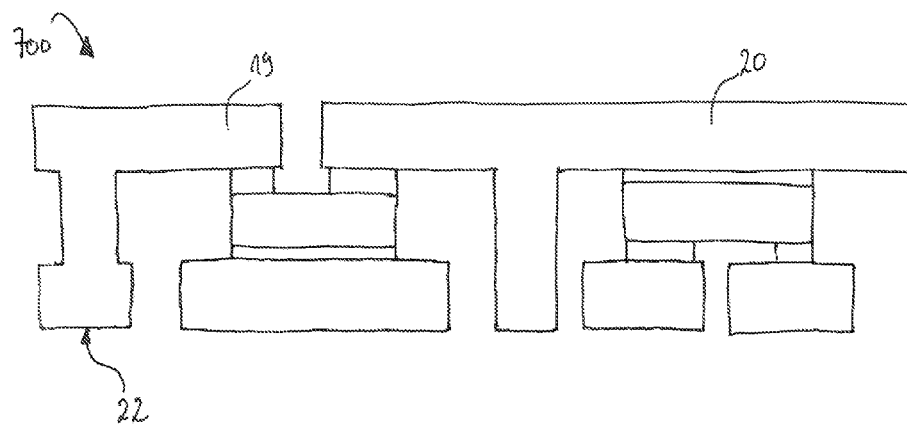
FIG. 7 schematically illustrates a cross-sectional view of a multichip device according to another embodiment.

FIG. 7 schematically illustrates a cross-sectional view of a multichip device 700 according to another embodiment. The multichip device 700 may be similar to one or more of the multichip devices described above. The description made in connection with foregoing figures thus may also hold true for the multichip device 700. In particular, the multichip device 700 may be similar to the multichip device of FIG. 5B. Compared to FIG. 5B, at least one of the end sections of the vertical parts of the electrically conductive elements 19, 20 may be broadened. In the exemplary FIG. 7, only the end section of the vertical part of the first electrically conductive element 19 is broadened, which may result in an increased contact surface of the exposed contact area 22, for example. The footprint of e.g. the exposed contact area 22 may be flexibly chosen depending on a desired functionality of the multichip device 700. The multichip device 700 of FIG. 7 may be processed by applying further acts. For example, the acts of FIGS. 5C and/or 5D may be applied.

Figure 8:
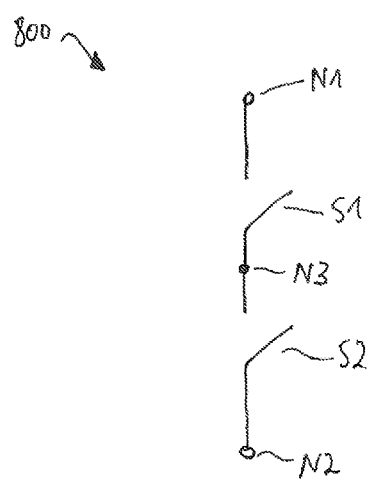
FIG. 8 illustrates a schematic diagram of a half bridge circuit.

FIG. 8 illustrates a schematic diagram of a half bridge circuit 800. A multichip device in accordance with the disclosure may be configured to operate as such a half bridge circuit. The half bridge circuit 800 may be arranged between nodes N1 and N2. The half bridge circuit may include switches S1 and S2 connected in series. The power semiconductor chips 1 and 2, as e.g. shown in FIG. 5D of the multichip device 500, may be implemented as the switches S1 and S2. Constant electrical potentials may be applied to the nodes N1 and N2. For example, a high potential, such as 10, 50, 100, 200, 500 or 1000 V or any other potential, may be applied to the node N1 and a low electrical potential, for example 0 V, may be applied to the node N2. Thus, the first semiconductor chip 1 may be configured to act as the high side switch (S1), whereas the second semiconductor chip 2 may be configured to act as the low side switch (S2). The switches S1 and S2 may be switched at frequencies in the range from 1 kHz to 100 MHz, but the switching frequencies may also be outside this range. This means that a varying electrical potential may be applied to a node N3 arranged between the switches S1 and S2 during an operation of the half bridge. The potential of the node N3 may vary in the range between the low and the high electrical potential.

The half bridge circuit may, for example, be implemented in electronic circuits for converting DC voltages, so-called DC-DC converters. DC-DC converters may be used to convert a DC input voltage provided by a battery or a rechargeable battery into a DC output voltage matched to the demand of electronic circuits connected downstream. DC-DC converters may be embodied as step down converters, in which the output voltage is less than the input voltage, or as step up converters, in which the output voltage is greater than the input voltage. Frequencies of several MHz or higher may be applied to DC-DC converters. Furthermore, currents of up to 50 A or even higher may flow through the DC-DC converters.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the term "exemplary" is merely meant as an example, rather than the best or optimal. It is also to be appreciated that features and/or elements depicted herein are illustrated with particular dimensions relative to each other for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific aspects shown and described without departing from the scope of the disclosure. This application is intended to cover any adaptations or variations of the specific aspects discussed herein. Therefore, it is intended that this disclosure be limited only by the claims and the equivalents thereof.

What is claimed is:

1. A multichip device, comprising:
    a first semiconductor chip arranged over a first carrier;
    a second semiconductor chip arranged over a second carrier; and
    an electrically conductive element electrically coupling the first semiconductor chip and the second semiconductor chip, wherein the electrically conductive element comprises a first exposed contact area.

2. The multichip device of claim 1, wherein the electrically conductive element comprises at least one of a clip and a part of a first leadframe.

3. The multichip device of claim 1, wherein the first exposed contact area is configured to provide an electrical coupling between the electrically conductive element and a component external to the multichip device.

4. The multichip device of claim 1, wherein the electrically conductive element comprises a first part and a second part substantially perpendicular to the first part, wherein the first part electrically couples the first semiconductor chip and the second semiconductor chip, and wherein an end section of the second part comprises the first exposed contact area.

5. The multichip device of claim 1, wherein the electrically conductive element is U-shaped, T-shaped or L-shaped.

6. The multichip device of claim 1, wherein the first carrier is electrically insulated from the second carrier.

7. The multichip device of claim 1, further comprising:
    a leadframe comprising the first carrier and the second carrier.

8. The multichip device of claim 1, wherein the first exposed contact area is substantially arranged between the first carrier and the second carrier.

9. The multichip device of claim 1, wherein the first exposed contact area and at least one of a surface of the first carrier and a surface of the second carrier are coplanar.

10. The multichip device of claim 1, further comprising:
    an encapsulation material at least partly encapsulating the electrically conductive element.

11. The multichip device of claim 10, wherein the first exposed contact area and a surface of the encapsulation material are coplanar.

12. The multichip device of claim 1, wherein at least one of the first semiconductor chip and the second semiconductor chip comprises a power semiconductor device.

13. The multichip device of claim 1, wherein the first semiconductor chip comprises a source contact, the second semiconductor chip comprises a drain contact, and the electrically conductive element electrically couples the source contact and the drain contact.

14. The multichip device of claim 1, further comprising:
    a half bridge circuit comprising a high side switch and a low side switch, wherein the first semiconductor chip comprises the high side switch and the second semiconductor chip comprises the low side switch.

15. The multichip device of claim 1, wherein the electrically conductive element comprises a second exposed contact area.

16. The multichip device of claim 15, further comprising:
    a passive electronic component electrically coupled to the second exposed contact area.

17. A multichip device, comprising:
    a first semiconductor chip;
    a second semiconductor chip; and
    a T-shaped electrically conductive element comprising a first end section, a second end section and a third end section, wherein the first end section is electrically coupled to the first semiconductor chip, the second end section is electrically coupled to the second semiconductor chip, and the third end section comprises an exposed contact area.

18. The multichip device of claim 17, wherein the electrically conductive element comprises at least one of a clip and a part of a leadframe, and wherein at least one of the first semiconductor chip and the second semiconductor chip comprises a power semiconductor device.

19. A multichip device, comprising:
   a first semiconductor chip;
   a second semiconductor chip; and
   an L-shaped electrically conductive element comprising a first part and a second part substantially perpendicular to the first part, wherein the first part electrically couples the first semiconductor chip and the second semiconductor chip, and the second part comprises an exposed contact area.

20. The multichip device of claim 19, wherein the electrically conductive element comprises at least one of a clip and a part of a leadframe, and wherein at least one of the first semiconductor chip and the second semiconductor chip comprises a power semiconductor device.

\* \* \* \* \*